United States Patent [19]
Lungo

[11] 3,980,022
[45] Sept. 14, 1976

[54] FILTER DEVICE FOR HIGH ACCELERATION APPLICATIONS

[76] Inventor: Antonio Lungo, 7076 Big Creek Parkway, Middleburg Heights, Ohio 44130

[22] Filed: Oct. 24, 1974

[21] Appl. No.: 517,402

[52] U.S. Cl. .............................. 102/70.2 R; 310/9.1; 333/72
[51] Int. Cl.² ................... F42C 19/06; H01L 41/00
[58] Field of Search ................. 102/70.2 R, 70.2 P, 102/70.2 GA; 333/70 S, 72, 71; 331/158, 163, 154; 324/80; 325/312, 310; 310/9.1–9.4

[56] References Cited
UNITED STATES PATENTS

| | | | |
|---|---|---|---|
| 2,315,392 | 3/1943 | Bokovoy | 310/9.4 |
| 2,416,067 | 2/1947 | Robb et al. | 310/9.4 |
| 2,488,781 | 11/1949 | Reeves | 310/9.2 |
| 2,814,741 | 11/1957 | Minnich et al. | 310/9.1 |
| 2,965,773 | 12/1960 | Hill, Jr. | 310/9.1 |
| 3,054,915 | 9/1962 | Houck | 310/9.1 |
| 3,185,870 | 5/1965 | Stoddard et al. | 310/9.4 |
| 3,221,189 | 11/1965 | Brandt et al. | 310/9.1 |

Primary Examiner—Charles T. Jordan
Attorney, Agent, or Firm—Teare, Teare & Sammon

[57] ABSTRACT

A filter device for use in high acceleration applications, such as in the firing control of an artillery shell, including a resonator and a mounting assembly for supporting the resonator in a predetermined orientation during acceleration of the device. The mounting assembly includes a yieldable support means which provides a compliant mounting to enable substantially unrestricted vibrational movement of the resonator. The mounting assembly includes a support member which is disposed in predetermined spaced relation from the resonator for abutting engagement with the resonator to provide a firm support to limit the resonator's displacement during acceleration. The support means is arranged to return the resonator to its initial position out of engagement with the support member subsequent to acceleration of the device to enable the resonator to vibrate unrestrictedly as aforesaid.

10 Claims, 3 Drawing Figures

FILTER DEVICE FOR HIGH ACCELERATION APPLICATIONS

BACKGROUND OF THE INVENTION

The present invention is related to filter devices, more particularly, filter devices which are subject to high acceleration forces, such as will be encountered in the firing control of an artillery shell.

In the aforementioned application, the artillery shell will be accelerated for a very short period of time, such as a few miliseconds, to a very high speed. The acceleration period will last only during the time that the shell is in the propelling device, such as a cannon or gun. During this period of time, the acceleration forces on the shell will be extremely great, and will terminate when the shell leaves the propelling device.

Heretofore, the firing controls for such shells employed capacitors and coils which were encapsulated to provide a sufficiently rigid construction to resist the large acceleration forces imparted thereto. Although such former devices were of sufficiently rugged construction, to avoid damages when subjected to large acceleration forces, they have not been found to have satisfactory stability when subjected to temperature variations. In addition, other former devices employed quartz crystal which were configured for thickness mode vibrations to operate at very high frequencies, such as in the megahertz range, requiring a considerably large number of divider circuits to make them suitable for operation in the required frequency range for artillery shell firing controls. Therefore, it has been found desirable to provide a filter device which would be sufficiently rugged to resist damage when subjected to such large acceleration forces, but also would require less divider circuits, and thus result in less space and lower power requirements.

SUMMARY OF THE INVENTION

The present invention contemplates providing an improved construction for a filter device adapted for use in high acceleration applications such as in the firing controls of an artillery shell. More particularly, the filter device comprises a resonator and a mounting assembly for supporting the resonator in a predetermined orientation during acceleration of the device. The mounting assembly includes a yieldable support means which provides a compliant mounting for substantially unrestricted vibrational movement of the resonator subsequent to acceleration of the device. The mounting assembly further includes a support member which is disposed in predetermined spaced relation from the resonator being adapted for abutting engagement with the resonator to limit its displacement during acceleration, and thus, assure maintenance of supporting engagement with the support means. The support means is connected to the resonator so as to return the resonator to its operating position out of engagement with the support member subsequent to acceleration of the device to enable the said vibrational movement thereof. More specifically, the resonator includes a generally flat body, and the support means comprises resilient contact means disposed in engagement with opposite sides of the body to enable the body to move in the direction of its general plane. The body is of a bar-like configuration having generally parallel lengthwise extending side edges, and one of the side edges extends in spaced, close proximity to the support member for abutting engagement therewith upon acceleration of the device. Still further, the contact means comprises coil springs made of an electrically-conductive material, and the resonator includes electroded regions on its opposite sides being adapted for electrical connection to the springs. The mounting assembly further includes a base, and a pair of spaced-oppositely-disposed circuit boards mounted on the base on opposite sides of the resonator. The contact means further comprises oppositely-disposed sets of coil springs with each of the springs having one end in engagement with the circuit boards and the opposite end disposed in engagement with the electroded regions on the resonator. The springs have their central axis extending generally perpendicular to the general plane of the resonator being supported in their lengthwise direction on the support member for lengthwise deflection to provide a restoring force for returning the resonator to its operative position in spaced relation from the support member after termination of the acceleration forces. The support member is of a tiered construction having at least two levels for supporting the springs for engagement with the electroded regions adjacent the side edges of the resonator.

By the foregoing arrangement, there is provided an improved filter device which is of a construction which is capable of withstanding the forces of acceleration during the firing of an artillery shell without sustaining damage thereto, and which further requires substantially less divider circuits for operation at the required frequency resulting in a substantial space saving and lower power requirements as compared to former known filter devices used in such applications.

DESCRIPTION OF THE PREFERRED EMBODIMENTS

Figure 1:
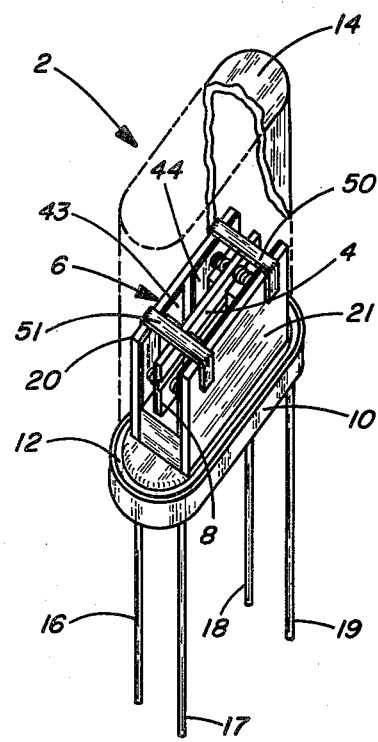
FIG. 1 is a perspective view of the filter device of the present invention.

Referring now to FIG. 1, the filter device of the present invention is illustrated generally at 2, and is shown as including a resonator element 4. The resonator element 4 is supported by a yieldable mounting assembly 6 which is arranged to support the resonator element in a predetermined orientation while minimizing the mechanical restraint or loading on the resonator 4 during operation of the device. The resonator element 4 has a predetermined electrode configuration on its opposite sides, as at 8, which is electrically connected to the mounting assembly being adapted for mounting in an external control circuit, as will be described in more detail hereinafter. Although the device 2 is shown in a vertical position, and the relationship of the components are described hereinafter in such position, it is to be understood that, in operation, the device may be positioned in a horizontal position or some in between position.

Figure 2:
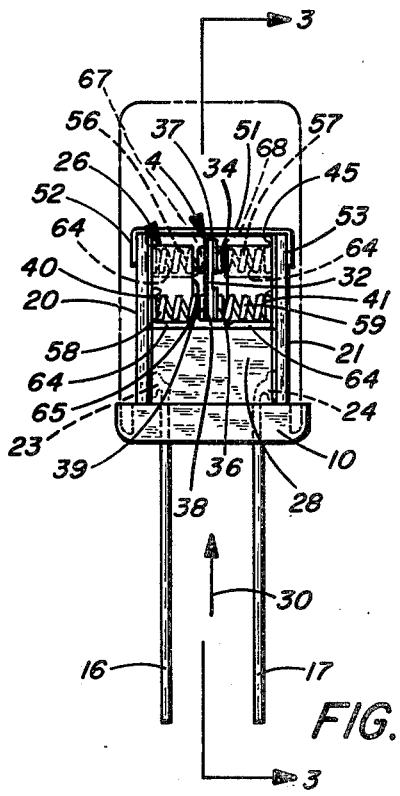
FIG. 2 is an end elevation view of the filter device shown in FIG. 1.
Figure 3:
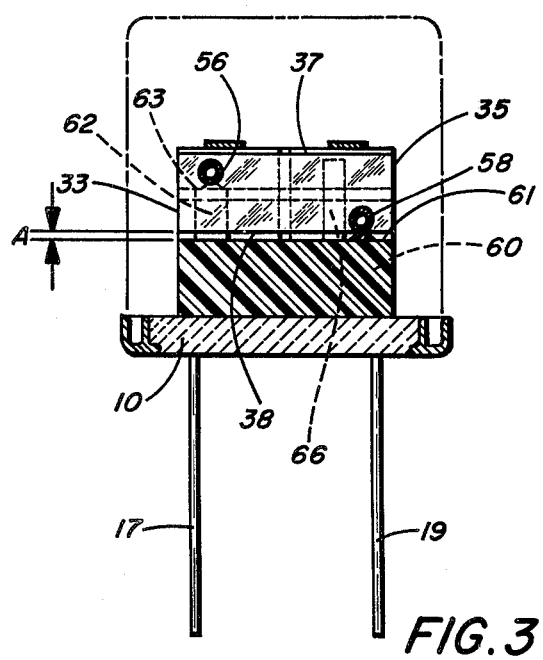
FIG. 3 is a transverse section taken along the line 3—3 of FIG. 2.

As shown in FIGS. 1 to 3, the mounting assembly 6 comprises a base or header 10 which is made of an insulating material, such as glass or the like, and which includes a moat 12 for slidably receiving the lower end of a can or cover, as indicated at 14. Terminal wires 16, 17, 18 and 19 extend through the base and are connected at their upper ends, such as at 23 and 24, to spaced, oppositely disposed printed circuit boards 20 and 21, such as by soldering or the like, as seen in FIG. 2, and are adapted at their opposite or lower ends for connection to external circuitry. As shown, the circuit boards 20 and 21 may be supported in upstanding relation on the base 10 on opposite sides of the resonator element 4, being electrically connected thereto by resilient contact means 26 disposed between the resonator 4 and the circuit boards 20 and 21 to provide a firm support for the resonator, as well as, enable substantially unrestricted vibrational movement of the resonator 4. A support member or pad 28 is supported by the base 10 in spaced relation with respect to the resonator 4 such that the resonator 4 is initially out of contact with the pad 28, whereas, upon acceleration of the device, as in a direction indicated by the arrow 30, the resonator 4 may move into abutting engagement with the support member 28 to limit its movement with respect to the mounting assembly to assure maintenance of contact between the contact means 26 and the circuit boards 20 and 21, and thus, greatly contribute to the operational reliability of the device.

As shown best in FIG. 1, the resonator 4 is of an elongated, bar-like construction having a generally flat body 32 made of a piezo-electric ceramic composition which may comprise lead zirconate-lead titanate as disclosed in U.S. Pat. Nos. 3,006,857 and 3,179,594, but, of course, it would be apparent to those skilled in the art that other materials could be utilized, such as quartz or other piezo-electric materials, which are considered equal to those compositions referred to in the above mentioned patents. Preferably, the body 32 is generally rectangular in configuration being defined by generally parallel lengthwise extending side edges 37 and 38 and generally parallel end edges 33 and 35 (FIG. 3). Further, the body is thin dimensionally having, for example, a length to width ratio of approximately 3:1 and a length to thickness ratio of approximately 15:1 to enable it to operate in a flexure bar mode at an operating frequency in a range of, for example, 10 kHz: 100 kHz. On the other hand, other body configurations, such as square, could be used to operate in other vibrational modes, such as planar, without departing from intent of the present invention.

In the form shown in FIG. 2, the electroded region 8 comprises a pair of electrode strips 34 and 36 on one face of the body 32 which extend lengthwise along the body 32 adjacent the upper side edge 37 and lower side edge 38 thereof, and a single electrode strip 39 on the opposite face to form a three-terminal network. The resonator element 4 is excited by applying a signal to one strip, such as 34, on the one face of the resonator body 32 and the single electrode strip 39 on the opposite side of the resonator body. As shown, the single electrode 39 is common to both the input and output circuits, and the output would be taken from the other electrode strip, such as 36. Of course, a two-terminal network could be provided by applying a signal to the electrode strips 34 and 36 or a four-terminal network could be provided by having two spaced electrode strips on each face of the resonator element 4.

The circuit boards 20 and 21 are supported in upstanding relation on the base 10 and may be constructed similar to the circuit boards described in the applicant's co-pending application, Ser. No. 458,712, being generally rectangular in configuration with each including a base portion 40 and 41 of non-conducting material, such as G-10 (resin impregnated) fiberglass or the like. In the three-terminal device shown, the terminal board 20 has a pair of spaced conductive layers 43 and 44 on its interior surface, whereas the circuit board 21 has a conductive layer 45 covering its entire interior surface. As best shown in FIG. 2, the circuit boards 20 and 21 may be supported along their lower edges by the base 10 being secured thereto, such as by a suitable adhesive or the like. The circuit boards 20 and 21 are retained in the upstanding position by channel-type straps 50 and 51 (FIG. 1) which have their opposite ends bent downwardly so as to form legs, such as at 52 and 53 (FIG. 2) for overlapping and connecting the upper edges of the circuit boards 20 and 21. The can, or cover 14, is preferably sized so that its inside surface will slide over and simultaneously contact the legs 45 and 46 to provide further structural support for the device 2 when in the installed position.

Now in accordance with the present invention, and as shown in FIG. 2, the contact means 26 supports the resonator 4 so as to enable it to move in the direction of its general plane while maintaining supporting contact therewith. More particularly, the contact means 26 includes one set of springs, such as metallic helical springs 56 and 57, which supportingly engage one end of the resonator 4 and another set of springs, including metallic helical springs 58 and 59, which supportingly engage the opposite end of the resonator 4. As shown best in FIG. 2, the springs 56, 57, 58 and 59 have their lengthwise axis extending generally perpendicular to the general plane of the resonator 4. The springs 56 and 57 are disposed in axially aligned relation on opposite sides of the resonator 4, with the spring 56 being slightly biased between the circuit board 20 and the resonator 4 having its inner end in contact with the strip 34 adjacent the upper edge 37 and its outer end in contact with the layer 34. The spring 57 is similarly biased between the circuit board 21, and the resonator 4 having its outer end in contact with the layer 45 and its inner end in contact with the strip 39. Likewise, the springs 58 and 59 are disposed in axial aligned relation with respect to one another on opposite sides of the resonator 4 being biased between the resonator 4 and the circuit boards 20 and 21, respectively. The spring 58 has its inner end in contact with the strip 36 adjacent the lower edge 38 and its outer end in contact with the layer 43, whereas, the spring 59 has its outer end in contact with the layer 45 and its inner end in contact with the strip 39 to complete the three-terminal network as aforesaid. The inner and outer ends of the springs 56 to 59 may be secured to the resonator 4 and the circuit boards 20 and 21 by a suitable adhesive, such as diluted RTV, which is a trade designation of the Dow-Corning Corp., of Midland, Michigan, to assure supporting engagement therebetween. As the nodal points of the resonator 4 in the form shown will be approximately one-fourth of the length of the resonator inward from its opposite edges 33 and 35, the springs 56 and 59 should be arranged such that their lengthwise axes coincide with such points on the resonator body. By this arrangement, the resonator 4 is supported so as to have its general plane extending generally parallel to the general plane of the circuit boards 20 and 21, and out of engagement with the remaining components of the mounting assembly so that it is not obstructed during its normal vibratory movement. Further, the resonator 4 may move in a direction toward and away from the circuit boards 20 and 21 against the compressive and tension forces applied thereon by the springs 56 to 59, as well as, in the direction of its general plane due to the capability of the springs to bend or be deflected in their lengthwise direction.

Preferably, the springs 56 to 59 are of an extremely light weight so as to be highly compliant and apply a virtually negligible force on the resonator 4. Thus, as shown in FIG. 2, the support pad 28 is constructed to support the springs 56 to 59 in their perpendicular relation to the general plane of the resonator, and more specifically, is of a tier construction for supporting the one set of springs, such as 56 and 57, a further distance away from the base 10 than the other set of springs, such as springs 58 and 59, so that they may engage the resonator 4 adjacent its upper edge 37 while the springs 58 and 59 engage the resonator adjacent the lower edge 38. As shown best in FIG. 3, the support pad 28 includes a base portion 60 providing a lower support surface 61, and one tier portion 62 providing an upper support surface 63. The tier portion 62 is shown as including a recess 65 through which the resonator 4 extends. Preferably, the tier portion 62 is of a height which enables the entire strip 34 adjacent the upper edge 37 of the resonator body 32 to be disposed above the support surface 66 for contact with the spring 56 when the lower edge 37 is disposed in spaced, close proximity to the lower support surface 61. In addition, the confronting walls 67 and 68 of the recess 65 are spaced from the confronting surfaces of the resonator 4, such as a distance of approximately 0.020 inches, to provide sufficient clearance therebetween during normal operation of the device.

As shown in FIG. 2, the springs 56 and 57 are supported in their lengthwise direction by the upper support surface 63 of the tier portion 62, whereas, the springs 58 and 59 are supported in their lengthwise direction by the lower support surface 61 of the base portion 60. In the form shown, the springs 56 to 59 are secured to the support surfaces 61 and 63 by a suitable adhesive, such as the aforementioned diluted RTV forming adhesive layers 64 which extend throughout substantially the full length of the springs 56 to 59. Thus, there is left a space along the lower support surface directly beneath the lower edge of the resonator 4 which is uncovered by the adhesive to enable the lower edge 30 of the resonator to move into contact with the lower support surface 61 when the resonator 4 moves downwardly in the direction of its general plane into contact with the pad 28. In practice, it has been found that, by supporting the lower edge 38 a distance, such as indicated by dimension A in FIGS. 2 and 3, of approximately 0.010 inches of the lower support surface 61, very satisfactory results have been achieved in the operation of the device.

Preferably, the support pad 28 is made of an elastomeric material, such as Sylgard 188, which is a trade designation of the Dow-Corning Corp., of Midland, Michigan, and has sufficient elasticity to allow a small axial deflection of the springs 56 to 59, and thus, enable the resonator 4 to move toward the support pad 28 in the direction of its general plane when the device is subjected to acceleration forces, as aforesaid. In addition, and as shown in FIG. 3, additional sub-tier portion, as at 66, may be provided on one or all of the support surfaces, such as 61 or 63, for engaging the sides of the springs, such as 56 to 59, to provide additional lateral support therefor in the event that such is considered necessary. In such a situation, the springs 56 to 59 may be secured to such sub-tier portions 66 along their sides, such as by the aforementioned diluted RTV adhesive.

As can be seen by the above arrangement, when acceleration forces are imparted to the device 2, in the direction indicated by the arrow 30 (FIG. 2), acceleration forces will be imparted to the components of the device 2 such that the resonator 4 will tend to be urged in the direction toward the support pad 28. The mounting assembly 6 is arranged to yield under such acceleration forces by allowing the springs 56 to 59 to flex or bend in their axial direction to allow the resonator 4 to move in the direction of its general plane into contact, such as along its lower edge 38, with the lower support surface 61 of the support pad 28. The mounting assembly 6 is further constructed such that resilient characteristics of the deflected springs 56 to 59, of the support pad 22 and the adhesive bond therebetween, will tend to return the springs to their original non-deformed condition such that the resonator will be forced to return to its initial position out of contact with the support pad 28 upon discontinuance of the acceleration force on the device to enable it to continue its normal, unobstructed operation.

I claim:

1. A filter device for use in high acceleration applications comprising, a resonator, a mounting assembly for supporting said resonator in a predetermined orientation during acceleration of said device, said mounting assembly including yieldable support means to provide a compliant mounting for substantially unrestricted vibrational movement of said resonator, subsequent to acceleration of the device, and said mounting assembly including a support member disposed in predetermined spaced relation from said resonator for abutting engagement with said resonator to limit its displacement during acceleration, and said support means being arranged to enable said abutting engagement during acceleration of said device and to return said resonator to a position out of engagement with said support member subsequent to acceleration of said device to enable said vibrational movement thereof.

2. A device in accordance with claim 1, wherein said resonator has an elongated body, said support means engages the opposite sides of said body to enable said body to move in the direction of its general plane.

3. A device in accordance with claim 1, wherein said resonator is of a bar-like configuration having generally parallel, lengthwise extending opposite side edges, and one of said side edges extends in spaced, close proximity to said support member for engagement therewith upon acceleration of said device and movement of said resonator relative to said mounting assembly.

4. A device in accordance with claim 1, wherein said support means comprises resilient contact means for electrically connecting said resonator to said mounting assembly.

5. A device in accordance with claim 4, wherein said resonator includes electroded regions on its opposite sides, and said contact means comprises coil springs made of an electrically-conductive material electrically connected to said electroded regions.

6. A filter device for use in high acceleration applications comprising,
a resonator,
a mounting assembly for supporting said resonator in a predetermined orientation during acceleration of said device,
said mounting assembly including yieldable support means to provide a compliant mounting for substantially unrestricted vibrational movement of said resonator, subsequent to acceleration of the device, and
said mounting assembly including a support member disposed in predetermined spaced relation from said resonator for abutting engagement with said resonator to limit its displacement during acceleration,
said support means being arranged to return said resonator to a position out of engagement with said support member subsequent to acceleration of said device to enable said vibrational movement thereof, and
said support means comprising resilient contact means for electrically connecting said resonator to said mounting assembly,
said mounting assembly including a pair of spaced, oppositely disposed circuit boards on opposite sides of said resonator, and
said contact means comprising coil springs disposed between said circuit boards and said resonator for supporting said resonator in said predetermined orientation.

7. A filter device for use in high acceleration applications comprising,
a resonator,
a mounting assembly for supporting said resonator in a predetermined orientation during acceleration of said device,
said mounting assembly including yieldable support means to provide a compliant mounting for substantially unrestricted vibrational movement of said resonator, subsequent to acceleration of the device,
said mounting assembly including a support member disposed in predetermined spaced relation from said resonator for abutting engagement with said resonator to limit its displacement during acceleration,
said support means being arranged to return said resonator to a position out of engagement with said support member subsequent to acceleration of said device to enable said vibrational movement thereof,
said support means comprising resilient contact means for electrically connecting said resonator to said mounting assembly,
said mounting assembly including a base,
said resonator includes a flat body having electroded regions on its opposite sides for electrical contact with said contact means,
said contact means comprising oppositely disposed sets of coil springs,
each of said springs having one end supported by said base and the opposite end disposed in engagement with the electroded regions on said resonator.

8. A filter device for use in high acceleration applications comprising,
a resonator,
a mounting assembly for supporting said resonator in a predetermined orientation during acceleration of said device,
said mounting assembly including yieldable support means to provide a compliant mounting for substantially unrestricted vibrational movement of said resonator, subsequent to acceleration of the device,
said mounting assembly including a support member disposed in predetermined spaced relation from said resonator for abutting engagement with said resonator to limit its displacement during acceleration,
said support means being arranged to return said resonator to a position out of engagement with said support member subsequent to acceleration of said device to enable said vibrational movement thereof,
said support means comprising resilient contact means for electrically connecting said resonator to said mounting assembly,
said contact means comprising a plurality of end springs,
said springs having their central axes extending generally perpendicular to the general plane of said resonator, and
said springs are supported in their lengthwise direction on said support member to provide a restoring force for returning said resonator to its operative position in spaced relation from said support member after termination of the acceleration forces on said device.

9. A filter device for use in high acceleration applications comprising,
a resonator,
a mounting assembly for supporting said resonator in a predetermined orientation during acceleration of said device,
said mounting assembly including yieldable support means to provide a compliant mounting for substantially unrestricted vibrational movement of said resonator, subsequent to acceleration of the device,
said mounting assembly including a support member disposed in predetermined spaced relation from said resonator for abutting engagement with said resonator to limit its displacement during acceleration,
said support means being arranged to return said resonator to a position out of engagement with said support member subsequent to acceleration of said device to enable said vibrational movement thereof,
said support means comprising resilient contact means for electrically connecting said resonator to said mounting assembly,
said support member being of a tiered construction, and
said contact means comprising spaced, electrically conductive contact elements supported at different levels by said support member at spaced locations on said resonator.

10. A filter device for use in high acceleration applications comprising, a resonator, a mounting assembly for supporting said resonator in a predetermined orientation during acceleration of said device, said mounting assembly including yieldable support means to provide a compliant mounting for substantially unrestricted vibrational movement of said resonator, subsequent to acceleration of the device, said mounting assembly including a support member disposed in predetermined spaced relation from said resonator for abutting engagement with said resonator to limit its displacement during acceleration, said support means being arranged to return said resonator to a position out of engagement with said support member subsequent to acceleration of said device to enable said vibrational movement thereof, said support means comprising resilient contact means for electrically connecting said resonator to said mounting assembly, said support member including at least one tier, said tier including a recess journal thereon, said resonator extending through said recess, and said support means comprising contact members supported at one level on said support member and at another level on said tier for engagement adjacent the side edge of said resonator.

* * * * *